US012787257B2

(12) United States Patent
Zhao et al.

(10) Patent No.: US 12,787,257 B2
(45) Date of Patent: Nov. 3, 2026

(54) SEMICONDUCTOR STRUCTURE WITH A WORK FUNCTION STACKING STRUCTURE AND METHOD FOR MANUFACTURING SAME

(71) Applicant: CHANGXIN MEMORY TECHNOLOGIES, INC., Hefei City (CN)

(72) Inventors: Chunlei Zhao, Hefei City (CN); Yachao Xu, Hefei City (CN); Ruiqi Zhang, Hefei City (CN); Xiaoyu Yang, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 397 days.

(21) Appl. No.: 18/450,731

(22) Filed: Aug. 16, 2023

(65) Prior Publication Data

US 2024/0081044 A1 Mar. 7, 2024

Related U.S. Application Data

(63) Continuation of application No. PCT/CN2022/123745, filed on Oct. 8, 2022.

(30) Foreign Application Priority Data

Sep. 1, 2022 (CN) ......................... 202211065069.3

(51) Int. Cl.
*H10B 12/00* (2023.01)

(52) U.S. Cl.
CPC ........... *H10B 12/34* (2023.02); *H10B 12/053* (2023.02)

(58) Field of Classification Search
CPC ..... H10B 12/053; H10B 12/34; H10B 12/488
See application file for complete search history.

(56) References Cited

U.S. PATENT DOCUMENTS 6,099,939 A * 8/2000 Mittal .................. C23C 14/024 428/458
9,147,680 B2 9/2015 Trevino
(Continued)

FOREIGN PATENT DOCUMENTS

CN 104299897 A 1/2015
CN 105702730 A 6/2016
(Continued)

OTHER PUBLICATIONS

International Search Report in the international application No. PCT/CN2022/123745, mailed on Apr. 23, 2023. 6 pages with English translation.

*Primary Examiner* — Nelson Garces
(74) *Attorney, Agent, or Firm* — Syncoda LLC; Feng Ma

(57) ABSTRACT

A semiconductor structure includes a substrate and a word line (WL) structure. The WL structure includes: a work function stacking structure located in the substrate, where the work function stacking structure includes multiple sequentially and alternately stacked first work function layers and second work function layers, and a work function of the first work function layer is greater than a work function of the second work function layer; a WL conductive layer located in the substrate, and located on an upper surface of the work function stacking structure; and a gate oxide layer located between the work function stacking structure and the substrate as well as between the WL conductive layer and the substrate.

16 Claims, 22 Drawing Sheets

(56) References Cited

U.S. PATENT DOCUMENTS

| | | | | |
|---|---|---|---|---|
| 9,508,847 | B2 | 11/2016 | Oh | |
| 9,634,109 | B2 | 4/2017 | Oh | |
| 2015/0021694 | A1 | 1/2015 | Trevino | |
| 2016/0172488 | A1 | 6/2016 | Oh | |
| 2017/0047421 | A1 | 2/2017 | Oh | |
| 2019/0013204 | A1 | 1/2019 | Chan | |
| 2019/0378907 | A1 | 12/2019 | Wang | |
| 2023/0178439 | A1* | 6/2023 | Lee | H10D 64/027 |
| 2023/0178634 | A1* | 6/2023 | Lee | H10D 30/751 257/306 |
| 2024/0064964 | A1* | 2/2024 | Kim | H10B 12/315 |

FOREIGN PATENT DOCUMENTS

| | | | |
|---|---|---|---|
| CN | 108777261 | A | 11/2018 |
| CN | 113936999 | A | 1/2022 |
| JP | 2012124215 | A | 6/2012 |

* cited by examiner

SEMICONDUCTOR STRUCTURE WITH A WORK FUNCTION STACKING STRUCTURE AND METHOD FOR MANUFACTURING SAME

CROSS-REFERENCE TO RELATED APPLICATIONS

This is a continuation of International Patent Application No. PCT/CN2022/123745 filed on Oct. 8, 2022, which claims priority to Chinese Patent Application No. 202211065069.3 filed on Sep. 1, 2022. The disclosures of the above-referenced applications are hereby incorporated by reference in their entirety.

BACKGROUND

It is to be noted that the statements herein merely provide background information related to the present disclosure and unnecessarily constitute example technologies.

With the continuous development of semiconductor technologies, a critical dimension of a device is scaled down constantly. Accordingly, a gate oxide layer is thinner, and a gate leakage current is increased exponentially.

Following thickness reduction of the gate oxide layer, a gate cannot be well protected due to problems of a word line (WL) conductive layer, such as the polysilicon depletion effect (PDE), boron penetration, and incompatibility (such as Fermi-level pinning) with a high-K dielectric layer. This causes electric leakage easily.

SUMMARY

The disclosure relates to the technical field of semiconductors, and in particular to a semiconductor structure and a method for manufacturing the same.

According to various embodiments of the present disclosure, a semiconductor structure and a method for manufacturing the semiconductor structure are provided.

The present disclosure provides a semiconductor structure, including a substrate and a WL structure, where the WL structure includes: a work function stacking structure, a WL conductive layer, and a gate oxide layer. The work function stacking structure is located in the substrate. The work function stacking structure includes multiple sequentially and alternately stacked first work function layers and second work function layers. A work function of the first work function layer is greater than a work function of the second work function layer. The WL conductive layer is located in the substrate, and located on an upper surface of the work function stacking structure. The gate oxide layer is located between the work function stacking structure and the substrate as well as between the WL conductive layer and the substrate.

The present disclosure further provides a method for manufacturing a semiconductor structure, including the following operations: providing a substrate; forming a word line (WL) trench in the substrate; forming a gate oxide layer on a sidewall and a bottom of the WL trench, and forming a work function stacking structure on a surface of the gate oxide layer, wherein an upper surface of the work function stacking structure is lower than a top face of the WL trench; and the work function stacking structure includes multiple sequentially and alternately stacked first work function layers and second work function layers, and a work function of the first work function layer is greater than a work function of the second work function layer; and forming a WL conductive layer in the WL trench, the WL conductive layer being located on the upper surface of the work function stacking structure.

Details of one or more embodiments of the present disclosure will be illustrated in the following accompanying drawings and description. Other features, objectives, and advantages of the present disclosure become evident in the specification, claims, and accompanying drawings.

BRIEF DESCRIPTION OF THE DRAWINGS

To describe the technical solutions in the embodiments of the present disclosure or in the conventional art more clearly, the following briefly describes the accompanying drawings required for describing the embodiments or the conventional art. Apparently, the accompanying drawings in the following description show merely some embodiments of the present disclosure, and a person of ordinary skill in the art may still derive other accompanying drawings from these accompanying drawings without creative efforts.

REFERENCE NUMERALS

Figure 1:
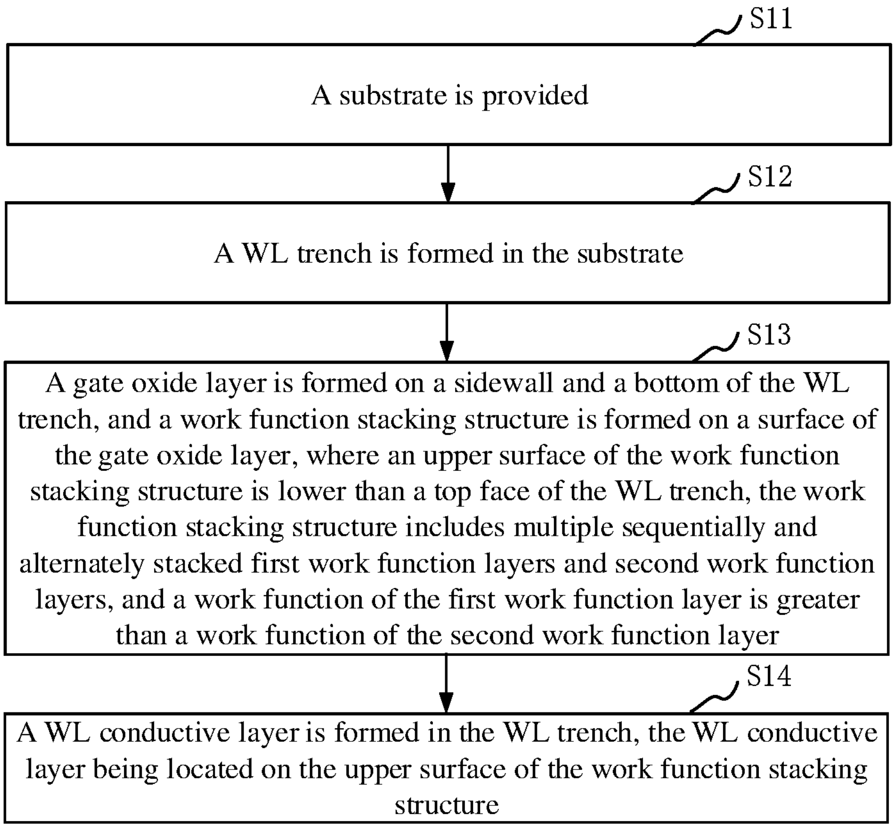
FIG. 1 is a flowchart of a method for manufacturing a semiconductor structure according to an embodiment.

1: substrate, 11: STI structure, 12: active area, 2: covering dielectric layer, 3: WL structure, 31: WL trench, 32: gate oxide layer, 321: gate oxide material layer, 33: work function stacking structure, 331: first work function layer, 3311: first work function material layer, 332: second work function layer, 3321: second work function material layer, 333: filling region, 34: WL conductive layer, 340: conductive material layer, 341: first conductive layer, 3411: first conductive material layer, 342: second conductive layer, 3421: second conductive material layer, 3422: barrier layer, 34221: barrier material layer, 3423: doped polysilicon layer, 34231: doped polysilicon material layer, and 4: insulating isolation layer.

DETAILED DESCRIPTION

To facilitate the understanding of the present disclosure, the present disclosure is described more completely below with reference to the related accompanying drawings. The preferred embodiments of the present disclosure are shown in the accompanying drawings. However, the present disclosure may be embodied in various forms without being limited to the embodiments described herein. On the contrary, these embodiments are provided to make the present disclosure more thorough and comprehensive.

Unless otherwise defined, all technical and scientific terms used herein have the same meaning as commonly understood by those skilled in the technical field of the present disclosure. The terms used in the specification of the present disclosure are merely for the purpose of describing specific embodiments, rather than to limit the present disclosure.

It should be understood that when an element or a layer is described as "being on", "being adjacent to", "being connected to" or "being coupled to" another element or layer, it can be on, adjacent to, connected to, or coupled to the another element or layer directly, or intervening elements or layers may be present. On the contrary, when an element is described as "being directly on", "being directly adjacent to", "being directly connected to" or "being directly coupled to" another element or layer, there are no intervening elements or layers. It should be understood that although terms such as first, second, and third may be used to describe various elements, components, regions, layers, doped types and/or sections, these elements, components, regions, layers, doped types and/or sections should not be limited by these terms. These terms are only used to distinguish one element, component, region, layer, doped type or section from another element, component, region, layer, doped type or section. Therefore, without departing from the teachings of the present disclosure, a first element, component, region, layer, doping type or section discussed below may be a second element, component, region, layer, doping type or section. For example, the first doping type may be the second doping type, and similarly, the second doping type may be the first doping type; or the first doping type and the second doping type are different doping types, for example, the first doping type may be P-type and the second doping type may be N-type, or the first doping type may be N-type and the second doping type may be P-type.

Spatial relationship terms such as "under", "beneath", "lower", "below", "above", and "upper" can be used herein to describe the relationship shown in the figure between one element or feature and another element or feature. It should be understood that in addition to the orientations shown in the figure, the spatial relationship terms further include different orientations of used and operated devices. For example, if a device in the accompanying drawings is turned over, an element or feature described as being "beneath another element", "below it", or "under it" is oriented as being "on" the another element or feature. Therefore, the exemplary terms "beneath" and "under" may include two orientations of above and below. In addition, the device may further include other orientations (for example, a rotation by 90 degrees or other orientations), and the spatial description used herein is interpreted accordingly.

In the specification, the singular forms of "a", "an" and "the/this" may also include plural forms, unless clearly indicated otherwise. It should also be understood that terms "include" and/or "comprise", when used in this specification, may determine the presence of features, integers, operations, operations, elements and/or components, but do not exclude the presence or addition of one or more other features, integers, operations, operations, elements, components and/or groups. In this case, in this specification, the term "and/or" includes any and all combinations of related listed items.

Embodiments of the present disclosure are described herein with reference to cross-sectional views as schematic diagrams of idealized embodiments (and intermediate structures) of the present disclosure, such that variations shown in the shapes and due to, for example, manufacturing techniques and/or tolerances can be contemplated. Therefore, the embodiments of the present disclosure should not be limited to the specific shapes of the regions shown herein, but include shape deviations due to, for example, manufacturing techniques. For example, an injection region displayed as a rectangle usually has a circular or curved feature and/or injection concentration gradient at an edge of the region, rather than a binary change from the injection region to a non-injection region. Similarly, a buried region formed by injection can lead to some injection in a region between the buried region and a surface through which the injection is carried out. The regions shown in the figure are schematic in nature, and their shapes are not intended to show actual shapes of the regions of the device or limit the scope of the present disclosure.

With the continuous development of semiconductor technologies, a critical dimension of a device is scaled down constantly. Accordingly, a gate oxide layer is thinner, and a gate leakage current is increased exponentially.

Following thickness reduction of the gate oxide layer, a gate cannot be well protected due to problems of a word line (WL) conductive layer, such as the polysilicon depletion effect (PDE), boron penetration, and incompatibility (such as Fermi-level pinning) with a high-K dielectric layer. This causes electric leakage easily.

In view of the problem that following the thickness reduction of the gate oxide layer, the WL conductive layer cannot protect the gate well to cause the electric leakage easily, the present disclosure provides a semiconductor structure and a method for manufacturing the semiconductor structure.

To achieve the above objective, the present disclosure provides a method for manufacturing a semiconductor structure. As shown in FIG. 1, the method for manufacturing a semiconductor structure may include the following operations.

In S11, a substrate is provided.

In S12, a WL trench is formed in the substrate.

In S13, a gate oxide layer is formed on a sidewall and a bottom of the WL trench, and a work function stacking structure is formed on a surface of the gate oxide layer, where an upper surface of the work function stacking structure is lower than a top face of the WL trench, the work function stacking structure includes multiple sequentially and alternately stacked first work function layers and second work function layers, and a work function of the first work function layer is greater than a work function of the second work function layer.

In S14, a WL conductive layer is formed in the WL trench, the WL conductive layer being located on the upper surface of the work function stacking structure.

According to the method for manufacturing a semiconductor structure in the above embodiment, by forming a WL trench in the substrate, forming a gate oxide layer on a sidewall and a bottom of the WL trench, and forming a work function stacking structure on a surface of the gate oxide layer, the problem of an increased gate leakage current due to thickness reduction of the gate oxide layer can be alleviated. The work function stacking structure includes multiple sequentially and alternately stacked first work function layers and second work function layers, and a work function of the first work function layer is greater than a work function of the second work function layer. A WL conductive layer is formed in the WL trench, and the WL conductive layer is located on the upper surface of the work function stacking structure. In this way, it is possible to alleviate the problems of the PDE, boron penetration, and incompatibility with the high-K dielectric layer for the WL conductive layer to reduce the electric leakage, thus better protecting the gate.

Specifically, the first work function layer may include a titanium nitride layer. The second work function layer may include, but is not limited to, a titanium layer, a tantalum layer or a tantalum nitride layer.

Figure 2:
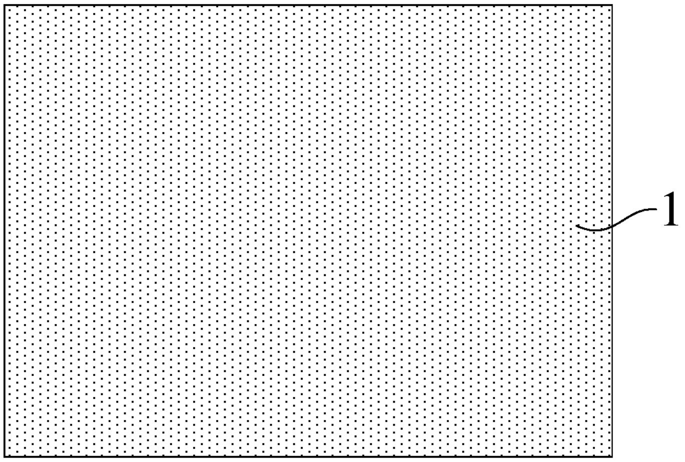
FIG. 2 is a schematic sectional view of a structure obtained in operation S11 in a method for manufacturing a semiconductor structure according to an embodiment of the present disclosure.

In operation S11, referring to operation S11 in FIG. 1 and FIG. 2, the substrate 1 is provided.

Specifically, the substrate 1 may include, but is not limited to, at least one of a silicon substrate, a germanium substrate, a silicon-germanium substrate, a gallium arsenide substrate, a gallium nitride substrate, or a silicon carbide substrate. Specifically, the substrate 1 may be any one of the silicon substrate, the germanium substrate, the silicon-germanium substrate, the gallium arsenide substrate, the gallium nitride substrate and the silicon carbide substrate, and may also be a composite substrate combined by two or more of the silicon substrate, the germanium substrate, the silicon-germanium substrate, the gallium arsenide substrate, the gallium nitride substrate and the silicon carbide substrate.

Figure 3:
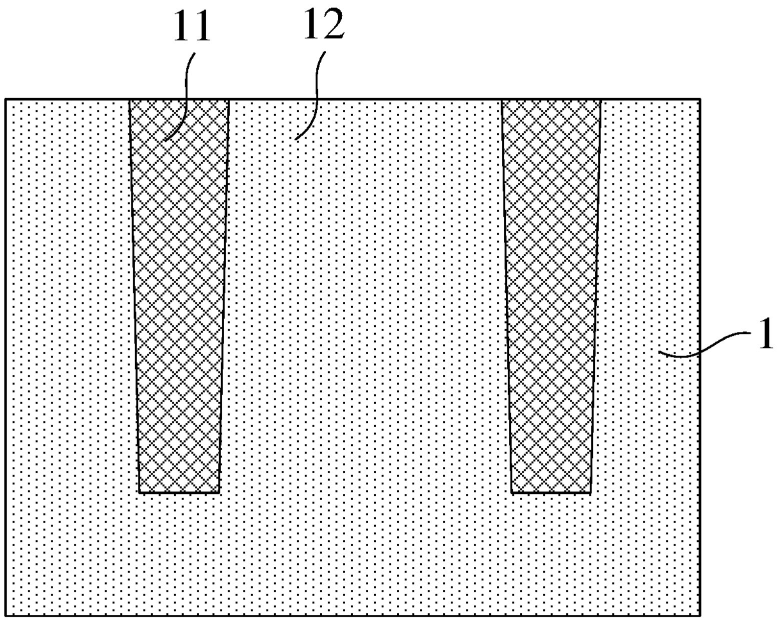
FIG. 3 is a schematic sectional view of a structure obtained in an operation of forming an STI structure in a substrate in a method for manufacturing a semiconductor structure according to an embodiment of the present disclosure.

In an embodiment, before the WL trench 31 is formed in the substrate 1, the method further includes that: An STI structure 11 is formed in the substrate 1. The STI structure 11 isolates multiple spaced-apart active areas 12 in the substrate 1. The active areas 12 each extend along a first direction. The WL trench 31 extends along a second direction. The second direction is intersected with the first direction. A resulting structure is as shown in FIG. 3.

Specifically, the STI structure 11 may be a structure in which a shallow-trench dielectric layer is filled in a shallow trench. The shallow-trench dielectric layer may be, but not limited to, a silicon dioxide layer.

In some examples, first ion implantation may be performed on the active area 12, so as to form a well area in the active area 12. Second ion implantation may be performed on the active area 12, so as to form a lightly doped area in the well area.

Specifically, if a first ion is an N-type ion, a second ion is a P-type ion. If the first ion is the P-type ion, the second ion is the N-type ion. The N-type ion may include at least one of a phosphorus ion, an arsenic ion, or an antimony ion. The P-type ion may include at least one of a boron ion, an indium ion, or a gallium ion.

The lightly doped area is shallower than the well area. For example, in a case where an upper surface of the well area is flush with an upper surface of the lightly doped area, a bottom of the well area is lower than a bottom of the lightly doped area. The lightly doped area may include a source area and a drain area.

In an embodiment, the operation that the STI structure 11 is formed in the substrate 1 may include the following operations.

A shallow trench is formed in the substrate 1.

A trench dielectric layer is filled in the shallow trench to form the STI structure 11.

Specifically, the shallow trench may be formed in the substrate 1 by dry etching. The trench dielectric layer may be filled in the shallow trench by deposition. The trench dielectric layer may be, but not limited to, a silicon dioxide layer.

Further, the operation that the shallow trench is formed in the substrate 1 may include the following operations.

A photoresist layer is formed on an upper surface of the substrate 1. The photoresist layer may be formed by spin coating.

Exposure is performed on the photoresist layer based on a first patterned reticle.

An exposed photoresist layer is developed to obtain a patterned photoresist layer.

The substrate 1 is etched based on the patterned photoresist layer to form the shallow trench in the substrate 1.

In some examples, the photoresist layer may include a positive photoresist layer, and may also include a negative photoresist layer.

Figure 4:
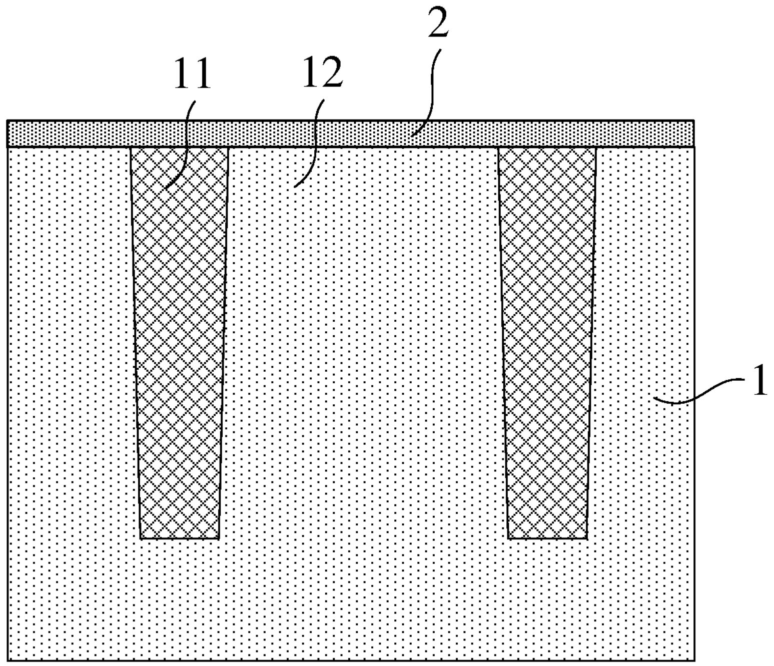
FIG. 4 is a schematic sectional view of a structure obtained in an operation of forming a covering dielectric layer on an upper surface of a substrate in a method for manufacturing a semiconductor structure according to an embodiment of the present disclosure.

In an embodiment, after the STI structure 11 is formed in the substrate 1, and before the WL trench 31 is formed in the substrate 1, the method may further include that: a covering dielectric layer 2 is formed on an upper surface of the substrate 1, as shown in FIG. 4. The WL trench 31 penetrates through the covering dielectric layer 2 along a thickness direction, and extends into the substrate 1, as shown in FIG. 6.

Specifically, the covering dielectric layer 2 may include a silicon dioxide layer or a silicon nitride layer.

Figure 5:
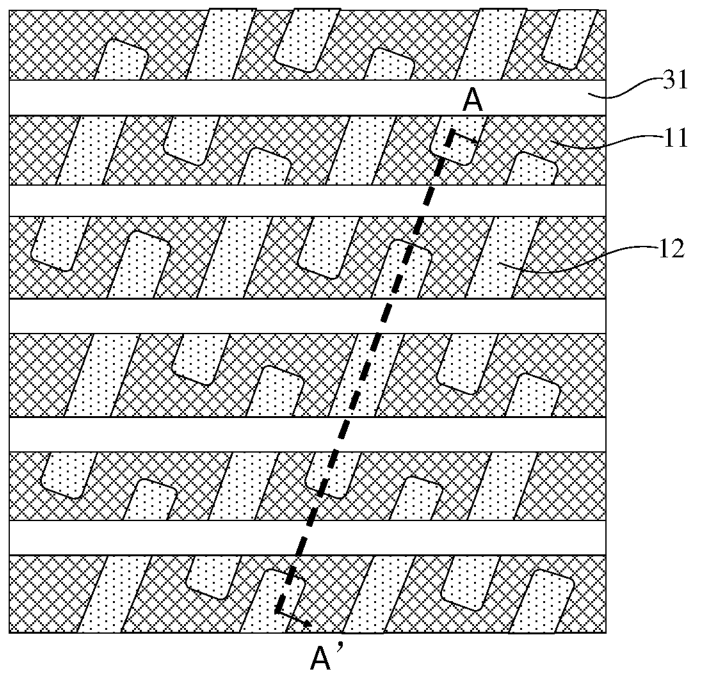
FIG. 5 is a schematic top view of a structure obtained in operation S12 in a method for manufacturing a semiconductor structure according to an embodiment of the present disclosure.
Figure 6:
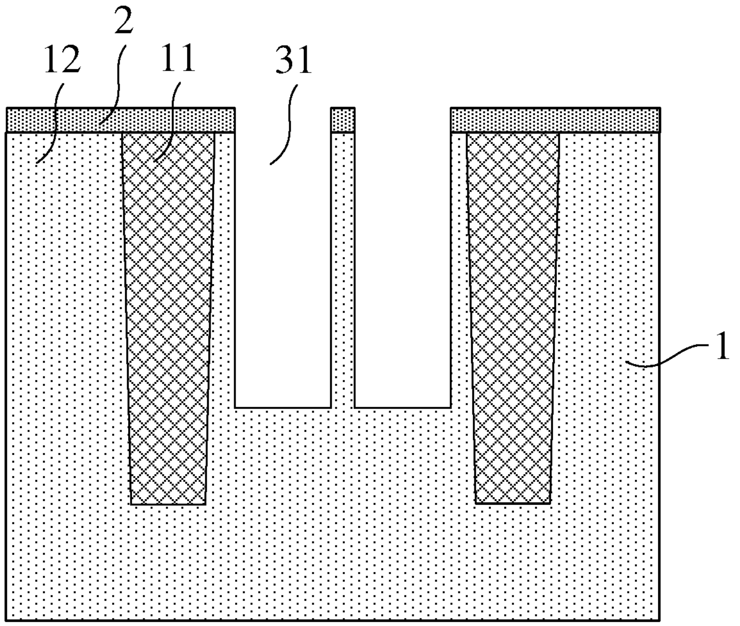
FIG. 6 is a schematic sectional view along A-A' of a structure shown in FIG. 5.

In operation S12, referring to operation S12 in FIG. 1 and FIG. 5 to FIG. 6, the WL trench 31 is formed in the substrate 1. FIG. 5 is a schematic top view of a structure obtained in operation S12 that the WL trench 31 is formed in the substrate 1. FIG. 6 is a schematic sectional view of a structure shown along A-A' in FIG. 5.

Specifically, the covering dielectric layer 2 and the substrate 1 may be etched along the thickness direction to form the WL trench 31 in the covering dielectric layer 2 and in the active area 12. The WL trench 31 may have a depth of 30 nm to 400 nm. Exemplarily, the WL trench 31 may have a depth of 30 nm, 50 nm, 100 nm, 200 nm, 300 nm or 400 nm, and may also have any depth between 30 nm and 400 nm. The depth is not limited to those listed in the embodiment.

Further, the operation that the WL trench 31 is formed in the substrate 1 may include the following operations.

In S121, a mask layer is formed on an upper surface of the covering dielectric layer 2. The mask layer may be at least one of a silicon nitride layer, a silicon carbide layer, or a silicon oxynitride layer.

In S122, exposure is performed on the mask layer based on a second patterned reticle.

In S123, an exposed mask layer is developed to obtain a patterned mask layer.

In S124, the covering dielectric layer 2 and the substrate 1 are etched sequentially along a thickness direction based on the patterned mask layer, to form the WL trench 31 in the active area 12.

The covering dielectric layer 2 and the substrate 1 may be etched in a manner including but not limited to dry etching. The WL trench 31 may have a depth of 30 nm to 400 nm. Exemplarily, the WL trench 31 may have a depth of 30 nm, 50 nm, 100 nm, 200 nm, 300 nm or 400 nm, and may also have any depth between 30 nm and 400 nm. The depth is not limited to those listed in the embodiment.

Figure 7:
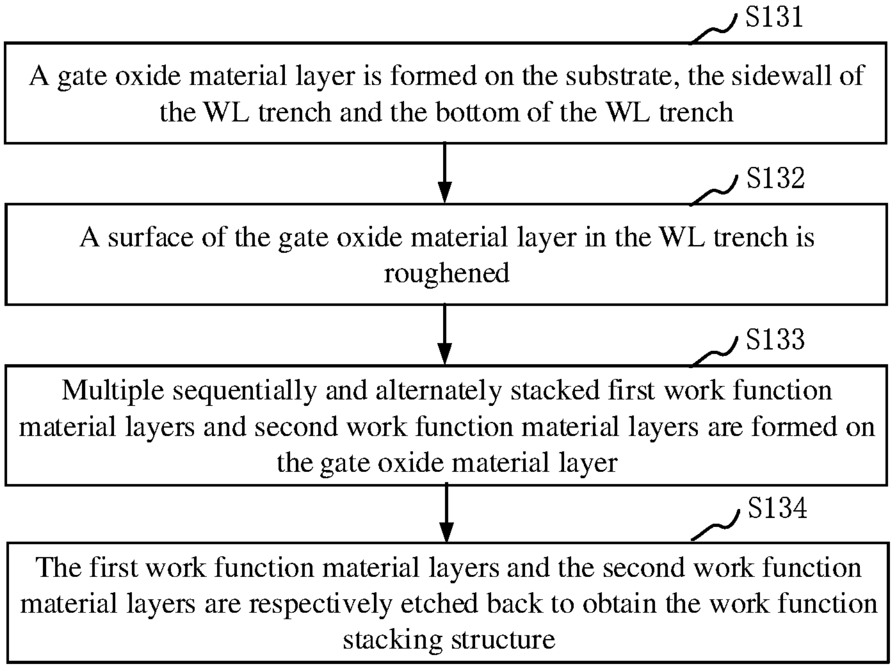
FIG. 7 is a flowchart of an operation S13 in a method for manufacturing a semiconductor structure according to an embodiment.

In an embodiment, as shown in FIG. 7, operation S13 that the gate oxide layer 32 is formed on the sidewall and the bottom of the WL trench 31 may include the following operations.

Figure 8:
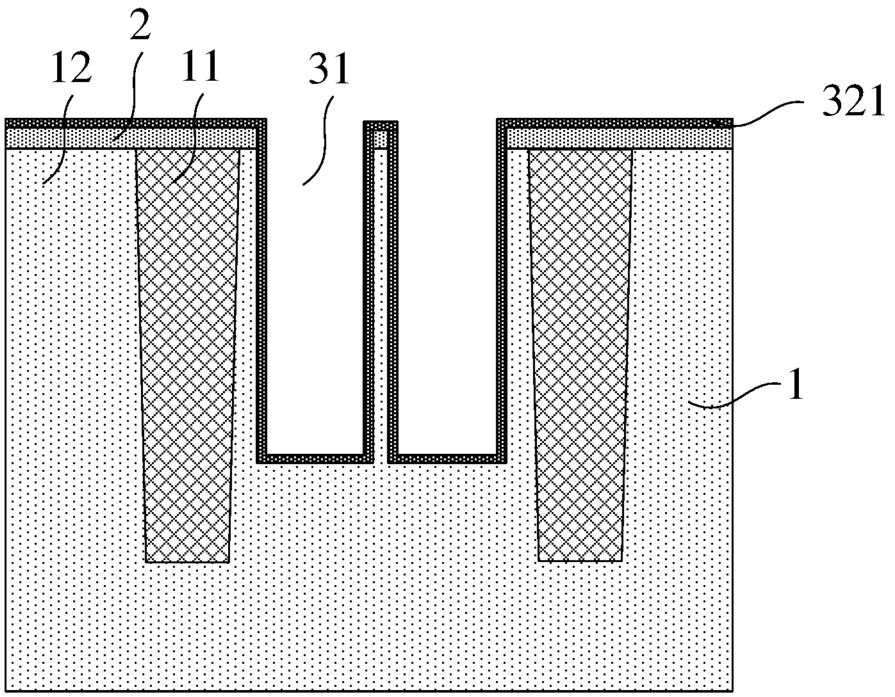
FIG. 8 is a schematic sectional view of a structure obtained in operation S131 in a method for manufacturing a semiconductor structure according to an embodiment of the present disclosure.

In S131, a gate oxide material layer 321 is formed on the substrate 1, the sidewall of the WL trench 31 and the bottom of the WL trench 31, as shown in FIG. 8.

Figure 9:
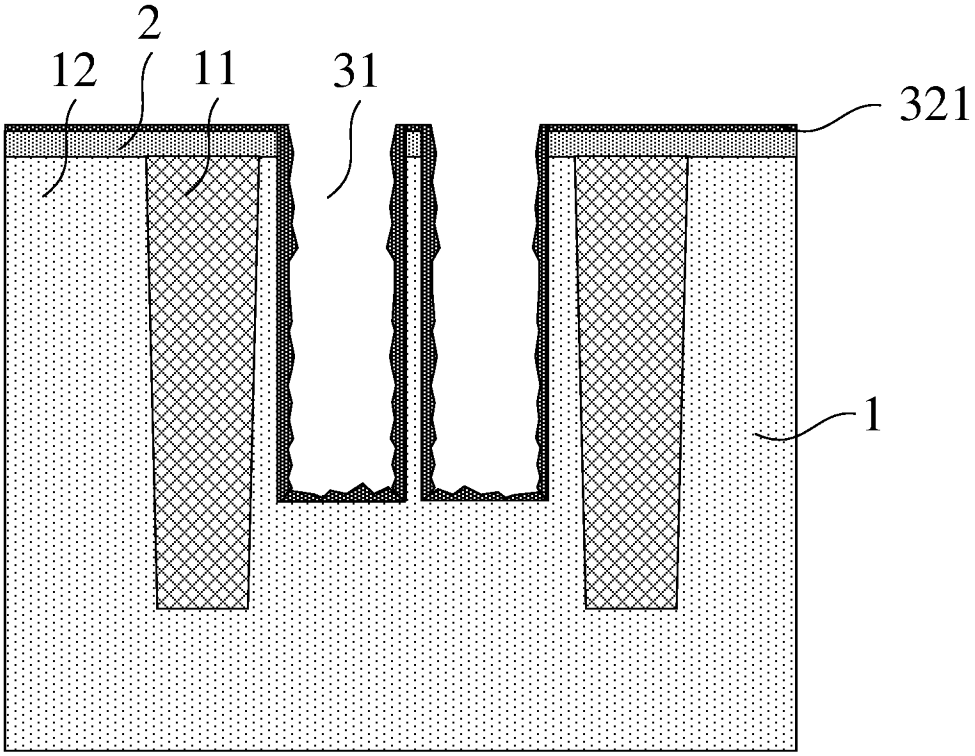
FIG. 9 is a schematic sectional view of a structure obtained in an operation of roughening a surface of a gate oxide material layer in a WL trench in a method for manufacturing a semiconductor structure according to an embodiment of the present disclosure.

In S132, a surface of the gate oxide material layer 321 in the WL trench 31 is roughened, as shown in FIG. 9.

It is to be noted that since the covering dielectric layer 2 is located on the upper surface of the substrate, the operation that the gate oxide material layer 321 is formed on the substrate 1, the sidewall of the WL trench 31 and the bottom of the WL trench 31 may include that the gate oxide material layer 321 is formed on the covering dielectric layer 2, the sidewall of the WL trench 31 and the bottom of the WL trench 31. Specifically, the upper surface of the covering dielectric layer 2, the sidewall of the WL trench 31 and the bottom of the WL trench 31 may be thermally oxidized to deplete a part of the covering dielectric layer 2, a part of the sidewall of the WL trench 31 and a part of the bottom of the WL trench, thereby obtaining the gate oxide material layer 321.

Further, the upper surface of the covering dielectric layer 2, the sidewall of the WL trench 31 and the bottom of the WL trench may be thermally oxidized by in-situ steam generation (ISSG) to obtain the gate oxide material layer 321. The gate oxide material layer 321 may include at least one of a silicon oxide layer, a silicon oxynitride layer, or a silicon oxycarbide layer. The ISSG refers to a novel rapid thermal process (RTP). At present, it is mainly applicable to equipment used to grow an ultra-thin oxide film, and prepare a sacrificial oxide layer and an oxynitride film.

In operation S132, the surface of the gate oxide material layer 321 in the WL trench 31 is roughened, such that the surface of the gate oxide material layer 321 is a rough surface. Thus, after the gate oxide material layer 321 out of the WL trench 31 is removed, a surface of the gate oxide layer 32 is a rough surface.

Specifically, when the surface of the gate oxide material layer 321 in the WL trench 31 is roughened, the surface of the gate oxide material layer 321 may be roughened with an ammonia/peroxide mix (APM) reagent. The APM reagent is obtained by mixing ammonium hydroxide ($NH_4OH$) and hydrogen peroxide ($H_2O_2$). The APM reagent makes the surface of the gate oxide material layer 321 rough, such that first work function material layer 3311 on the surface of the gate oxide material layer 321 is more compact structurally.

In an embodiment, referring also to FIG. 7, operation S13 that the work function stacking structure is formed on the surface of the gate oxide layer may include the following operations.

In S133, multiple sequentially and alternately stacked first work function material layers 3311 and second work function material layers 3321 are formed on the gate oxide material layer 321.

In S134, the first work function material layers 3311 and the second work function material layers 3321 are respectively etched back to obtain the work function stacking structure 33, the work function stacking structure 33 lining the WL trench 31 to form a filling region 333.

In an embodiment, operation S133 that the multiple sequentially and alternately stacked first work function material layers 3311 and second work function material layers 3321 are formed on the gate oxide material layer 321 may include the following operations.

Figure 10:
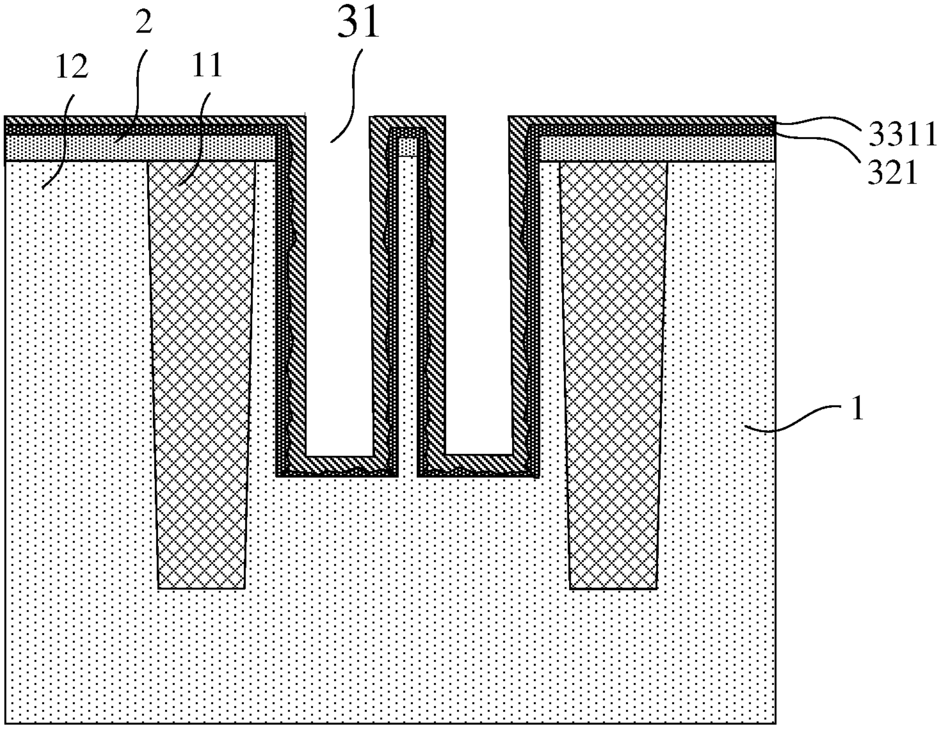
FIG. 10 is a schematic sectional view of a structure obtained in operation S1331 in a method for manufacturing a semiconductor structure according to an embodiment of the present disclosure.

In S1331, the first work function material layer 3311 is formed on the gate oxide material layer 321, as shown in FIG. 10.

Figure 11:
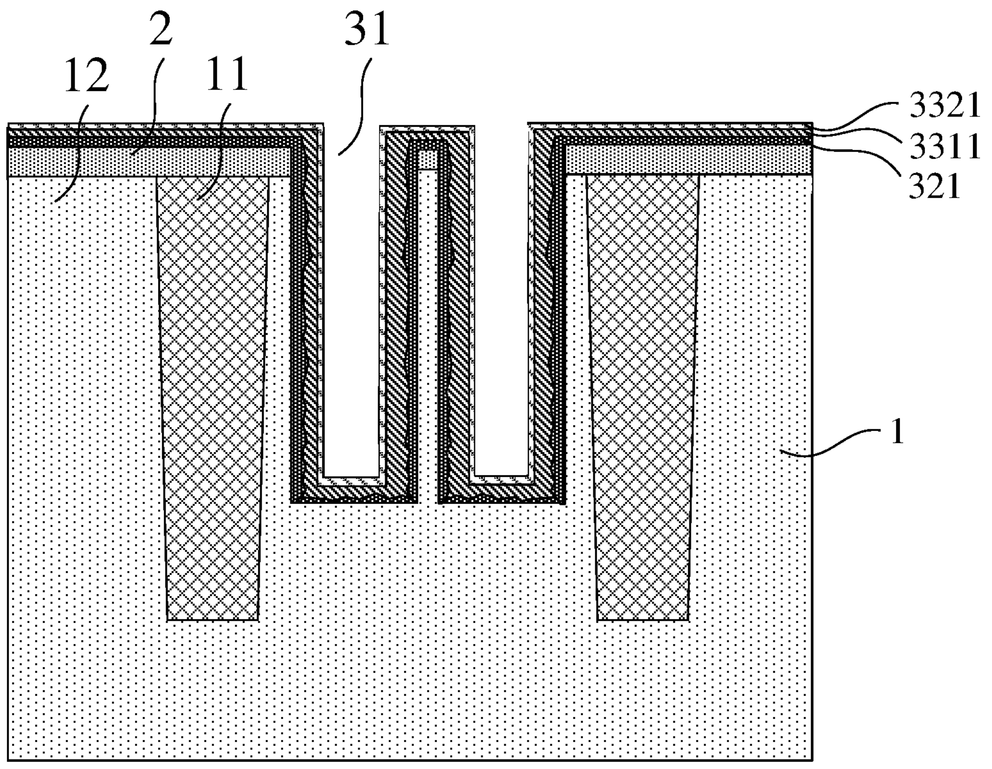
FIG. 11 is a schematic sectional view of a structure obtained in operation S1332 in a method for manufacturing a semiconductor structure according to an embodiment of the present disclosure.

In S1332: The second work function material layer 3321 is formed on the first work function material layer 3311, as shown in FIG. 11.

Figure 12:
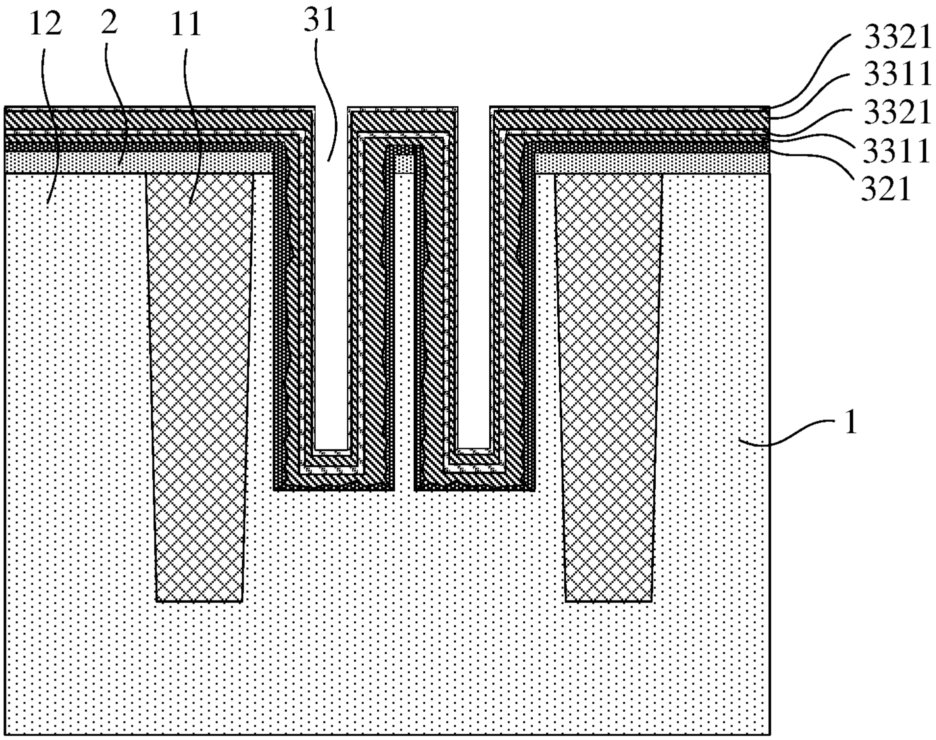
FIG. 12 is a schematic sectional view of a structure obtained in operation S1333 in a method for manufacturing a semiconductor structure according to an embodiment of the present disclosure.

In S1333, operations S1331 and S1332 are repeated to obtain the multiple sequentially and alternately stacked first work function material layers 3311 and second work function material layers 3321, as shown in FIG. 12.

Specifically, a titanium nitride material layer may be formed on the gate oxide material layer 321 to serve as the first work function material layer 3311. A titanium material layer, a tantalum material layer or a tantalum nitride material layer may be formed on the first work function material layer 3311 to serve as the second work function material layer 3321. That is, the first work function material layer 3311 may include the titanium nitride material layer. The second work function material layer 3321 may include, but is not limited to, the titanium material layer, the tantalum material layer or the tantalum nitride material layer. With fine grains, a low resistivity and stable chemical properties (good thermostability and corrosion resistance) of the titanium nitride, the first work function material layer 3311 may be made of the titanium nitride material layer, which can improve the performance and reduce the size of the semiconductor device.

It is to be noted that a work function of the first work function material layer 3311 may be greater than a work function of the second work function material layer 3321. With the greater work function of the first work function material layer 3311, stress accumulation is caused in formation of the first work function material layer 3311. Therefore, by combining the second work function material layer 3321 having the smaller work function with the first work function material layer 3311, there are a larger binding force and a smaller stress to reduce the electric leakage.

Exemplarily, the first work function material layer 3311 may have a thickness of 0.7 nm to 1.2 nm. Specifically, the first work function material layer 3311 may have a thickness of 0.7 nm, 0.8 nm, 0.9 nm, 1 nm, 1.1 nm or 1.2 nm, and may also have any thickness between 0.7 nm and 1.2 nm. The thickness is not limited to those listed in the embodiment.

Figure 13:
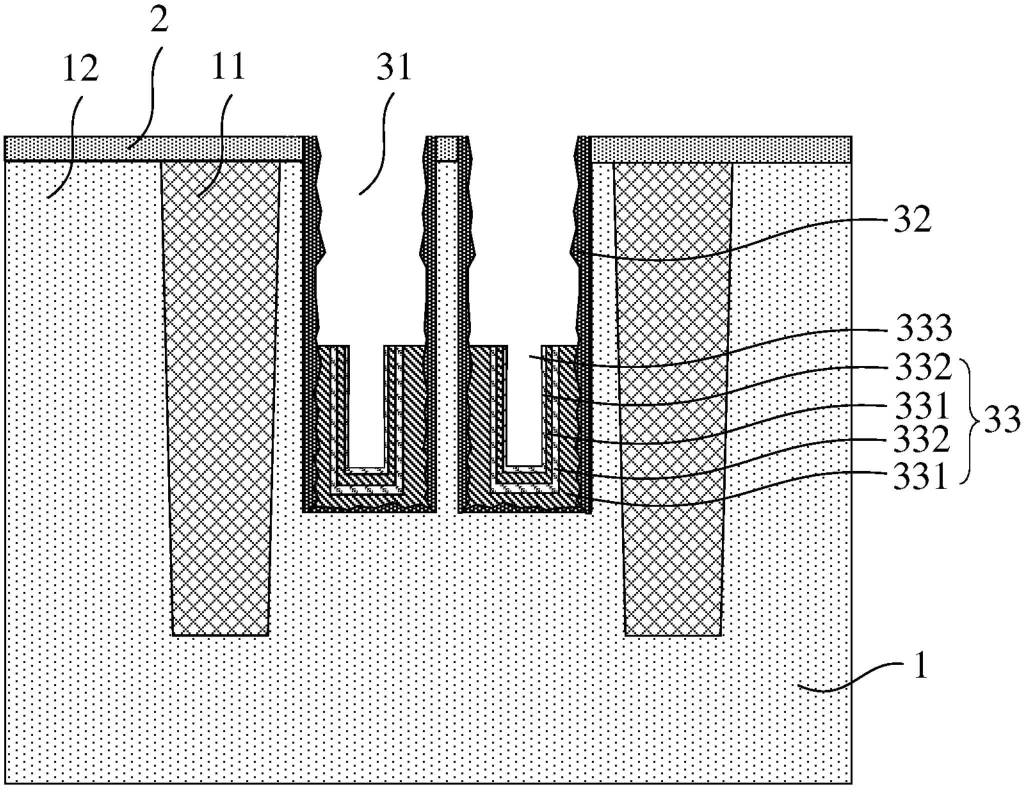
FIG. 13 is a schematic sectional view of a structure obtained in operation S133 in a method for manufacturing a semiconductor structure according to an embodiment of the present disclosure.

In operation S134, referring to FIG. 13, the first work function material layers 3311 and the second work function material layers 3321 in the WL trench 31 are respectively etched back to obtain the work function stacking structure 33, the work function stacking structure 33 lining the WL trench 31 to form a filling region 333. The work function stacking structure 33 includes the multiple sequentially and alternately stacked first work function layers 331 and second work function layers 332.

The first work function material layer 3311 and the second work function material layer 3321 each may be etched back with dry etching by a depth of 20 nm to 150 nm. Further, an etching gas used to etch the first work function material layer 3311 and the second work function material layer 3321 in the WL trench 31 may include at least one of sulfur hexafluoride, chlorine, methane, silicon chloride, or argon.

In an embodiment, referring to FIG. 13, while the first work function material layer 3311 and the second work function material layer 3321 in the WL trench 31 are etched back to obtain the work function stacking structure 33, the method further includes that: the gate oxide material layer 321 out of the WL trench 31 is removed by etching to obtain the gate oxide layer 32.

In an embodiment, operation S14 that the WL conductive layer 34 is formed in the WL trench 31 may include the following operations.

Figure 14:
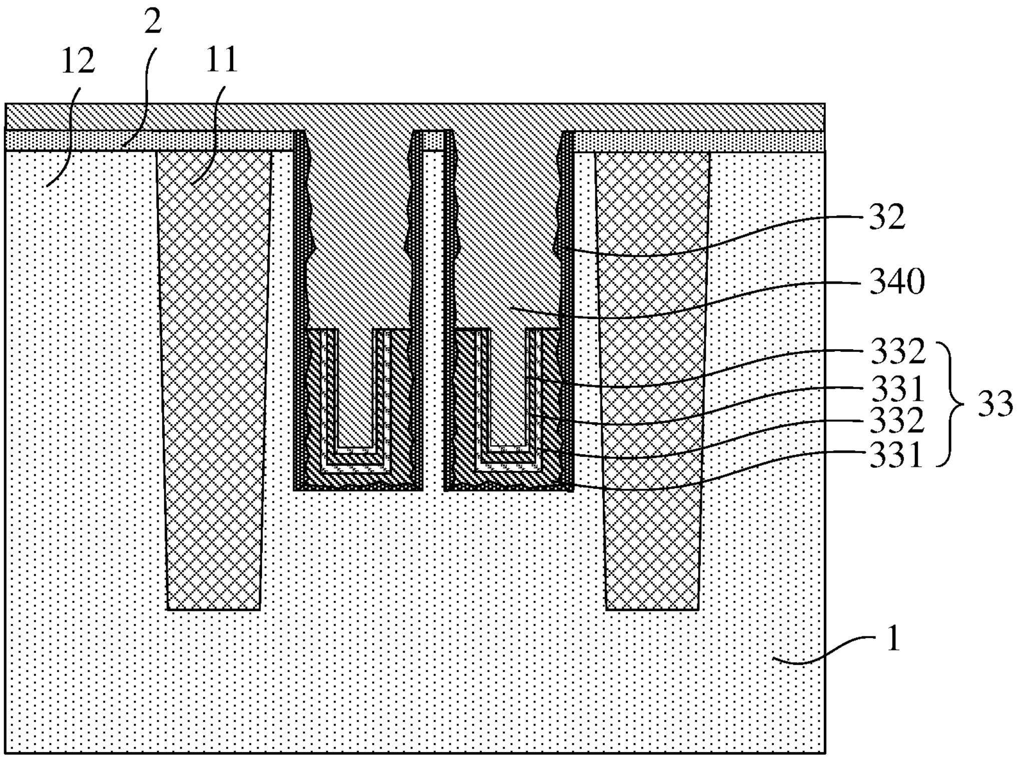
FIG. 14 is a schematic sectional view of a structure obtained in operation S141 in a method for manufacturing a semiconductor structure according to an embodiment of the present disclosure.

In S141, a conductive material layer 340 is deposited. The conductive material layer 340 fills up the filling region 333 and the WL trench 31, as shown in FIG. 14. Specifically, a part of the conductive material layer 340 may also be formed on the upper surface of the covering dielectric layer 2.

Figure 15:
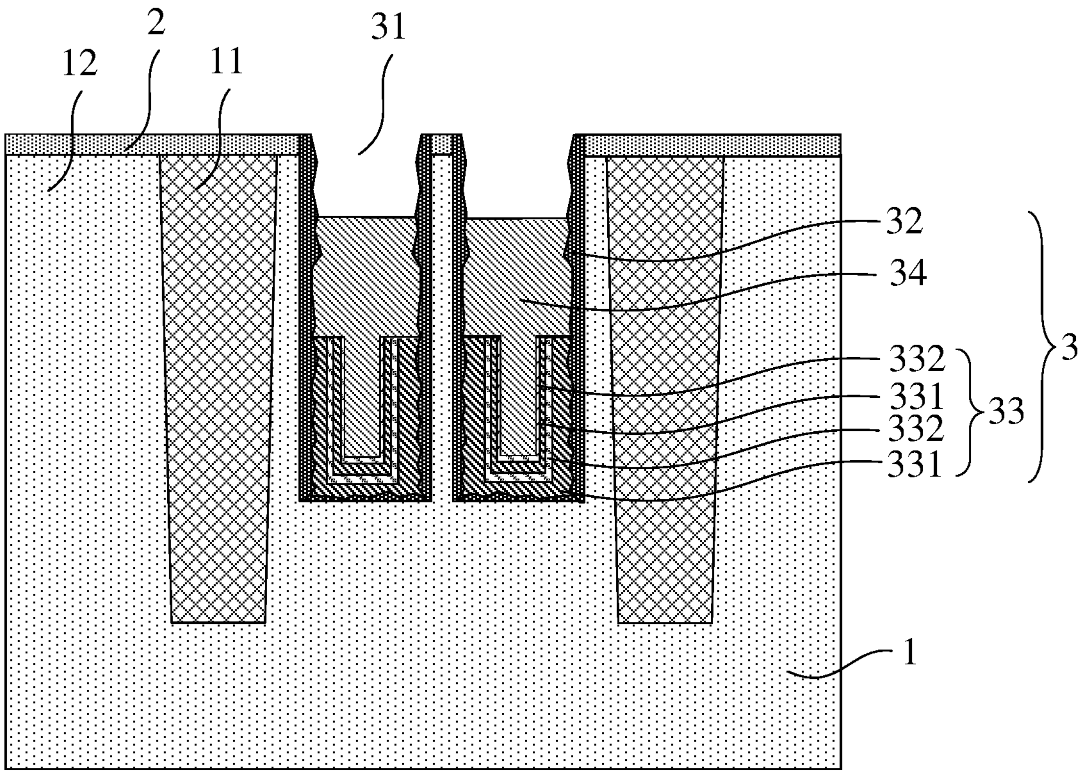
FIG. 15 is a flowchart of an operation S142 in a method for manufacturing a semiconductor structure according to an embodiment.

In S142, the conductive material layer 340 is etched back to obtain the WL conductive layer 34 in the WL trench 31, as shown in FIG. 15.

Specifically, a doped polysilicon material layer may be formed on the substrate 1 and in the WL trench 31 to serve as the conductive material layer 340. That is, the conductive material layer 340 may include the doped polysilicon material layer, and the WL conductive layer 34 may include the doped polysilicon material layer. An etched depth may be 30 nm to 70 nm, and dry etching may be used. In the embodiment, the WL conductive layer 34 may include a first portion and a second portion. The first portion is located in the filling region 333. The second portion covers a top face of the first portion and a top face of the work function stacking structure 33. The gate oxide layer 32, the work function stacking structure 33 and the WL conductive layer 34 jointly form the WL structure 3.

In some examples, low-step coverage process may be used to form the conductive material layer 340. Further, an N-type doped polysilicon material layer may be formed by the low-step coverage process to serve as the conductive material layer 340. That is, both the conductive material layer 340 and the WL conductive layer 34 may be made of an N-type doped polysilicon material. A doped ion may include, but is not limited to, at least one of a phosphorus ion, an arsenic ion, or an antimony ion. A doping concentration of the doped ions in the doped polysilicon material may be 10E20 $cm^{-3}$ to 20E20 $cm^{-3}$. Specifically, the doping concentration may be 10E20 $cm^{-3}$, 12E20 $cm^{-3}$, 15E20 $cm^{-3}$, 18E20 $cm^{-3}$ or 20E20 $cm^{-3}$, and may also be any concentration between 10E20 $cm^{-3}$ and 20E20 $cm^{-3}$. The concentration is not limited to those listed in the embodiment. The work function of the WL conductive layer 34 can be changed through the concentration of the doped ions. Therefore, by controlling the concentration of the N-type doped ion, the work function can be reduced, thereby lowering the risk of the electric leakage.

Specifically, the low-step coverage process can improve film uniformity of the conductive material layer 340. With an ultra-low spattering amount and a high deposition rate, this process can reduce material spattering and make an electric arc more stable, thereby obtaining the high-quality conductive material layer 340. With the low-step coverage process for depositing the N-type doped polysilicon material, the method has the simple process. Compared with a conventional process for forming the N-type doped polysilicon material in which the doped ion is easily depleted by an etching process, the low-step coverage process for depositing the N-type doped polysilicon material can supplement the doped ions. The doped N-typed ions can prevent the electric leakage well and improve a leakage current, thereby obtaining better performance of the device. Moreover, with the simple process, the cost can be saved.

Figure 16:
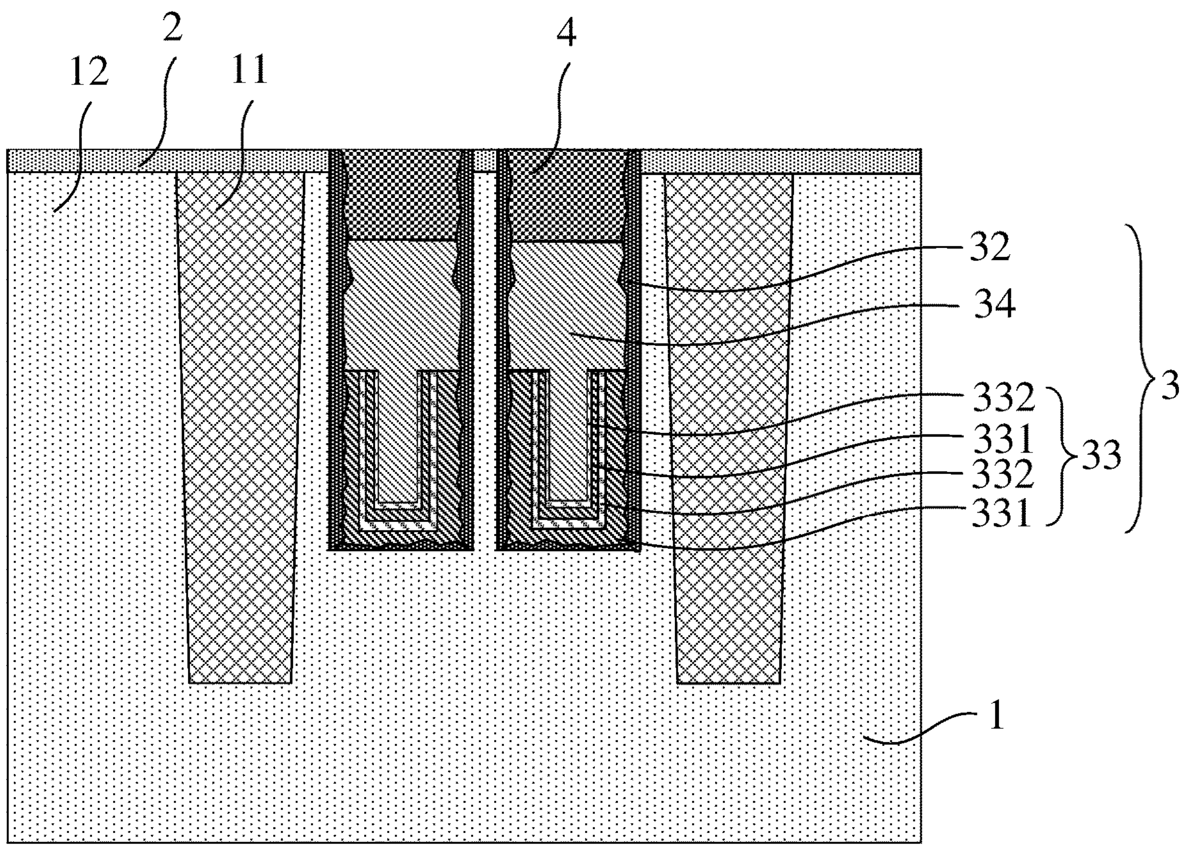
FIG. 16 is a schematic sectional view of a structure obtained in an operation of forming an insulating isolation layer on an upper surface of a WL conductive layer in a method for manufacturing a semiconductor structure according to an embodiment, the insulating isolation layer filling up a WL trench.

In the embodiment, referring to FIG. 15, an upper surface of the WL conductive layer 34 may be lower than the top of the WL trench 31. After the WL conductive layer 34 is formed in the WL trench 31, the method may further include that: An insulating isolation layer 4 is formed on the upper surface of the WL conductive layer 34, the insulating isolation layer 4 filling up the WL trench 31. A resulting structure is as shown in FIG. 16. Specifically, the insulating isolation layer 4 may include, but is not limited to, a silicon nitride layer or a silicon carbide layer.

In other embodiments, operation S14 that the WL conductive layer 34 is formed in the WL trench 31 may include the following operations.

In S1411, a first conductive layer 341 is formed, the first conductive layer 341 filling up the filling region 333.

In S1412, a second conductive layer 342 is formed, the second conductive layer 342 being located in the WL trench 31, and covering a top face of the first conductive layer 341 and a top face of the work function stacking structure 33.

The operation S1411 that the first conductive layer 341 is formed, the first conductive layer 341 filling up the filling region 333, may include the following operations.

Figure 17:
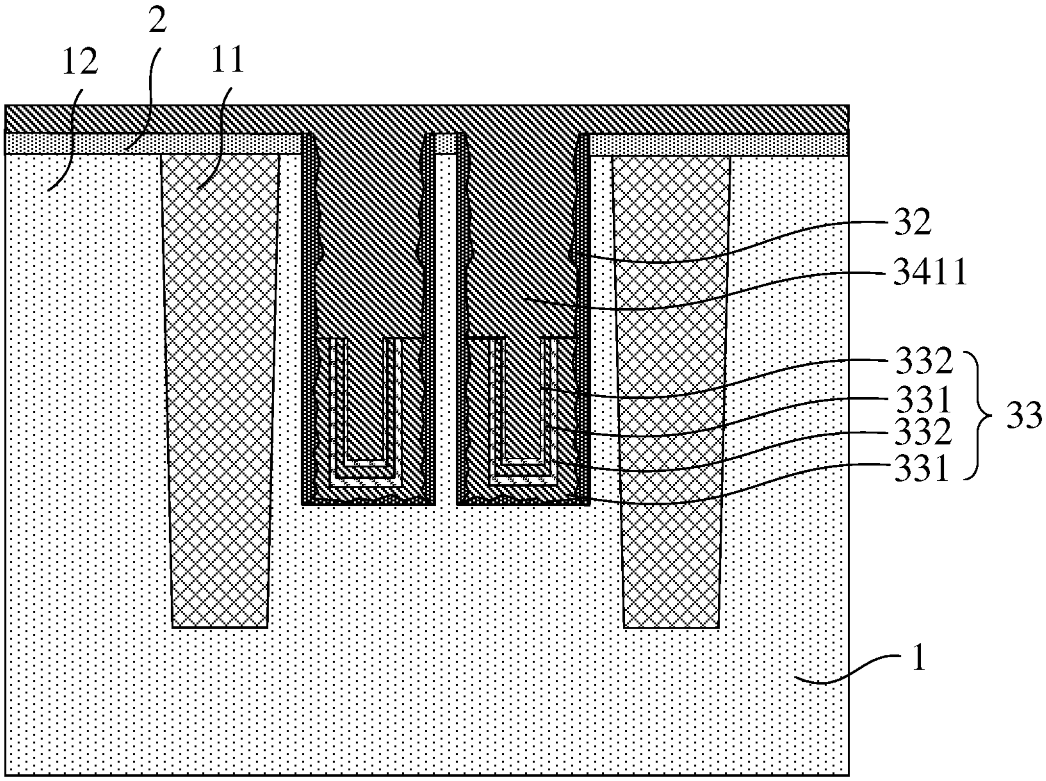
FIG. 17 is a schematic sectional view of a structure obtained in operation S14111 in a method for manufacturing a semiconductor structure according to an embodiment of the present disclosure.

In S14111, a first conductive material layer 3411 is formed on the upper surface of the covering dielectric layer 2, in the filling region 333 and in the WL trench 31, as shown in FIG. 17.

Figure 18:
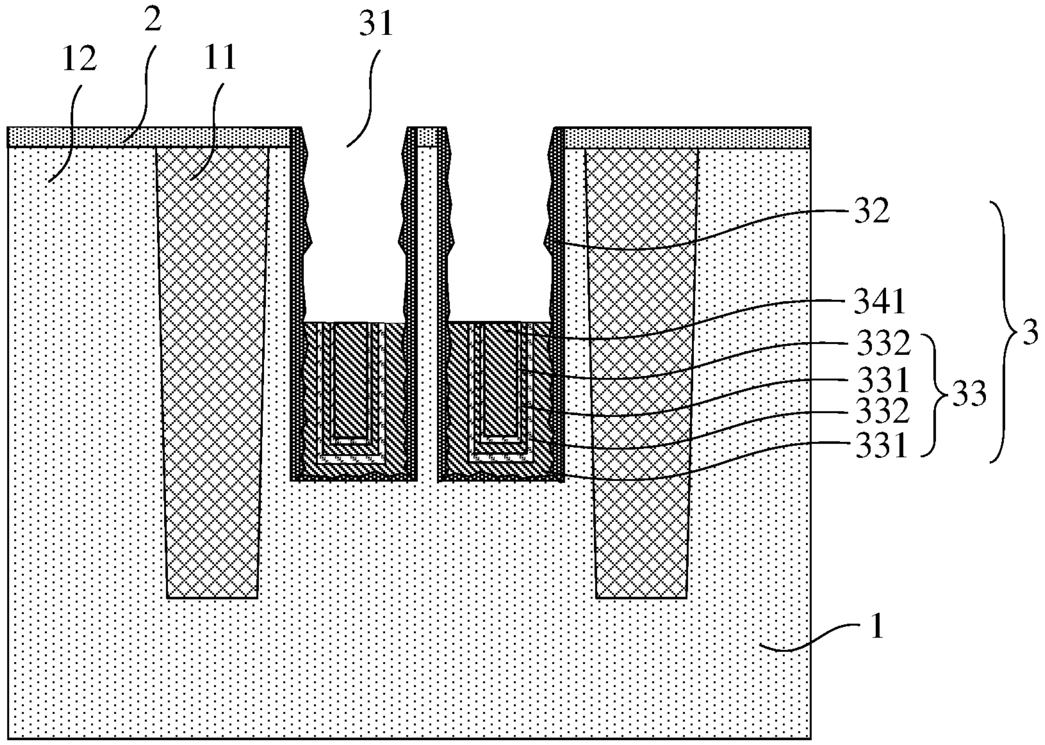
FIG. 18 is a schematic sectional view of a structure obtained in operation S14112 in a method for manufacturing a semiconductor structure according to an embodiment of the present disclosure.

In S14112, the first conductive material layer 3411 is etched back to obtain the first conductive layer 341 in the filling region 333, as shown in FIG. 18.

Specifically, a titanium nitride layer may be formed on the upper surface of the covering dielectric layer 2, in the filling region 333 and in the WL trench 31 to serve as the first conductive material layer 3411. The first conductive material layer 3411 may be etched back with dry etching by a depth of 50 nm to 200 nm. An etching gas may include at least one of sulfur hexafluoride, chlorine, methane, silicon chloride, or argon.

Figure 19:
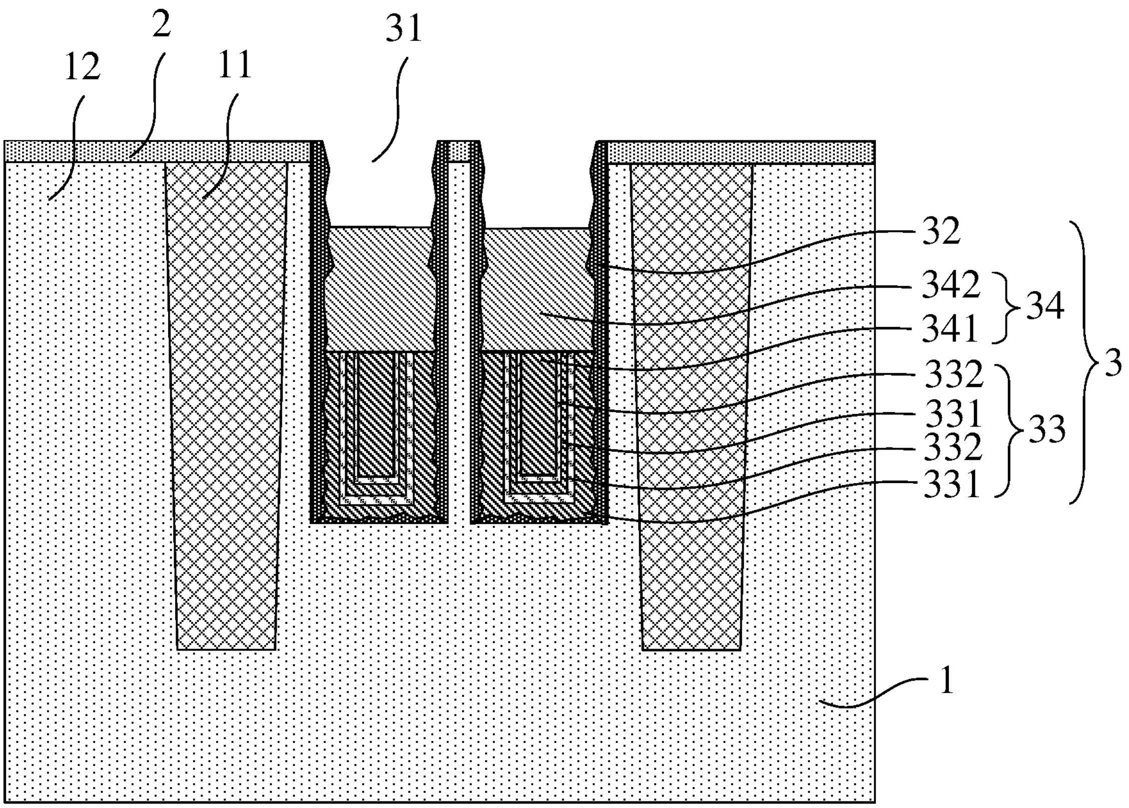
FIG. 19 is a schematic sectional view of a structure obtained in operation S1412 in a method for manufacturing a semiconductor structure according to an embodiment of the present disclosure.

In operation S1412, referring to FIG. 19, the second conductive layer 342 is formed, the second conductive layer 342 being located in the WL trench 31, and covering the top face of the first conductive layer 341 and the top face of the work function stacking structure 33.

Specifically, a doped polysilicon material layer may be formed on the upper surface of the covering dielectric layer 2 and in the WL trench 31 to serve as the second conductive layer 342. A doped ion in the doped polysilicon material layer may include, but is not limited to, at least one of a phosphorus ion, an arsenic ion, or an antimony ion. A doping concentration of the doped ions in the doped polysilicon material may be 10E20 $cm^{-3}$ to 20E20 $cm^{-3}$. Specifically, the doping concentration may be 10E20 $cm^{-3}$, 12E20 $cm^{-3}$, 15E20 $cm^{-3}$, 18E20 $cm^{-3}$ or 20E20 $cm^{-3}$, and may also be any concentration between 10E20 $cm^{-3}$ and 20E20 $cm^{-3}$. The concentration is not limited to those listed in the embodiment. The work function of the WL conductive layer 34 can be changed through the concentration of the doped ions. Therefore, by controlling the concentration of the N-type doped ion, the work function can be reduced, thereby lowering the risk of the electric leakage. In the embodiment, the WL conductive layer 34 may include a first portion and a second portion. The first conductive layer 341 in the filling region 333 serves as the first portion. The second conductive layer 342 covering the top face of the first conductive layer 341 and the top face of the work function stacking structure 33 serves as the second portion.

Figure 20:
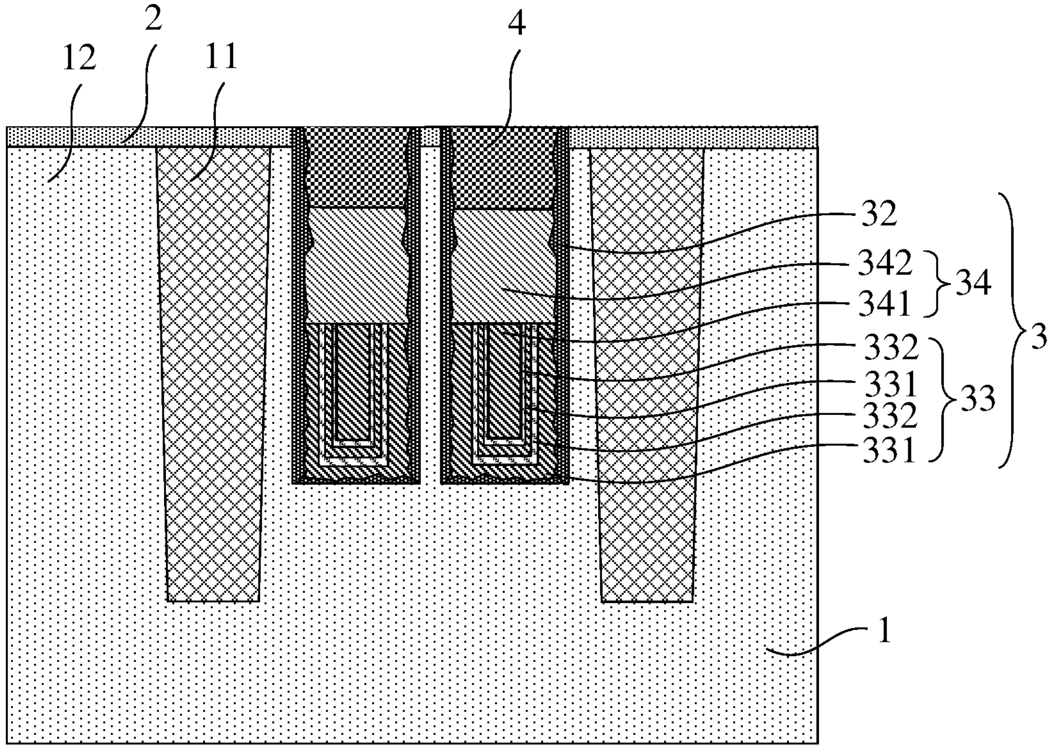
FIG. 20 is a schematic sectional view of a structure obtained in an operation of forming an insulating isolation layer on an upper surface of a WL conductive layer in a method for manufacturing a semiconductor structure according to an embodiment, the insulating isolation layer filling up a WL trench.

In the embodiment, referring to FIG. 19, the upper surface of the WL conductive layer 34 may be lower than the top of the WL trench 31. After the WL conductive layer 34 is formed in the WL trench 31, the method may further include that: An insulating isolation layer 4 is formed on the upper surface of the WL conductive layer 34, the insulating isolation layer 4 filling up the WL trench 31. A resulting structure is as shown in FIG. 20. Specifically, the insulating isolation layer 4 may include, but is not limited to, a silicon nitride layer or a silicon carbide layer.

In other embodiments, a metal layer may be used to form the first conductive material layer 3411. Specifically, the first conductive material layer 3411 is formed with the metal layer. The metal layer may be a tungsten metal layer. That is, the first conductive material layer 3411 and the first conductive layer 341 each may be the metal layer.

In the embodiment, the second conductive layer 342 may include a barrier layer 3422 and a doped polysilicon layer 3423. The barrier layer 3422 is formed between the doped polysilicon layer 3423 and the substrate 1. The second conductive layer 342 is located in the WL trench 31, and covers the top face of the first conductive layer 341 and the top face of the work function stacking structure 33. Therefore, the operation that the second conductive layer 342 is formed may include the following operations.

Figure 21:
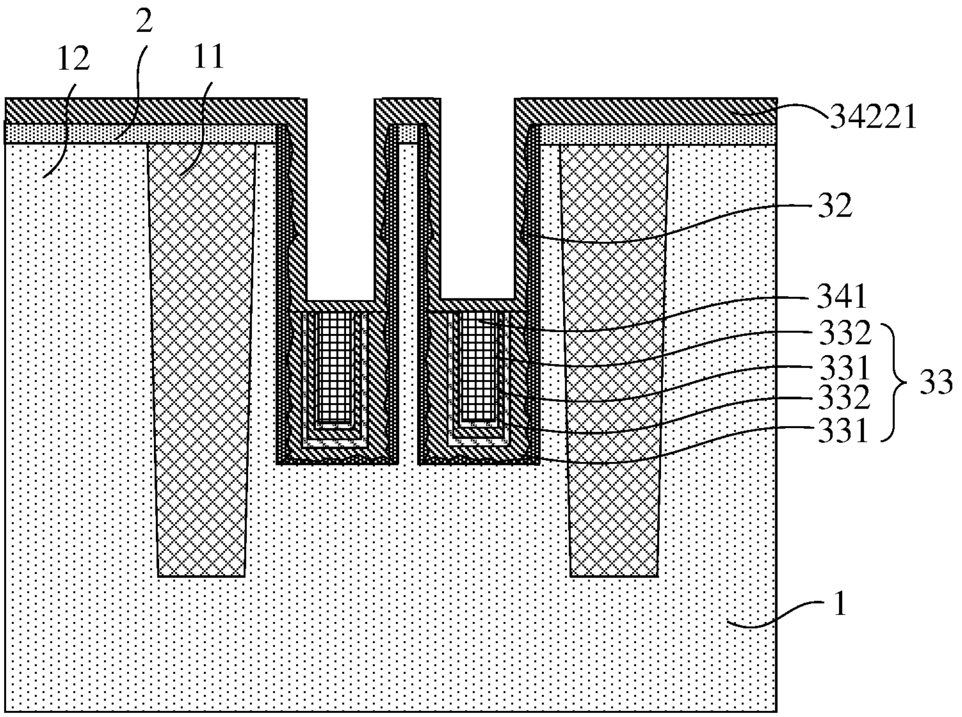
FIG. 21 is a schematic sectional view of a structure obtained in operation S14121 in a method for manufacturing a semiconductor structure according to an embodiment of the present disclosure.

In S14121, a barrier material layer 34221 is formed on the upper surface of the covering dielectric layer 2, the top face of the first conductive layer 341, the top face of the work function stacking structure 33 and the sidewall of the WL trench 31, as shown in FIG. 21.

Figure 22:
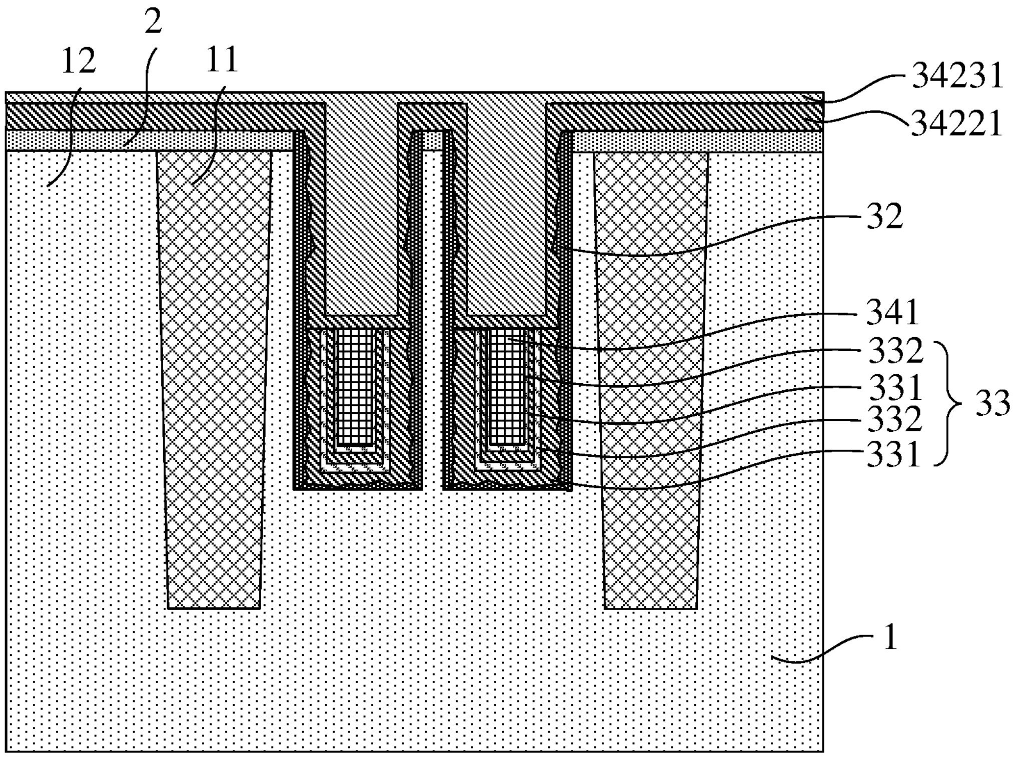
FIG. 22 is a schematic sectional view of a structure obtained in operation S14122 in a method for manufacturing a semiconductor structure according to an embodiment of the present disclosure.

In S14122, a doped polysilicon material layer 34231 is formed on an upper surface of the barrier material layer 34221, as shown in FIG. 22.

Figure 23:
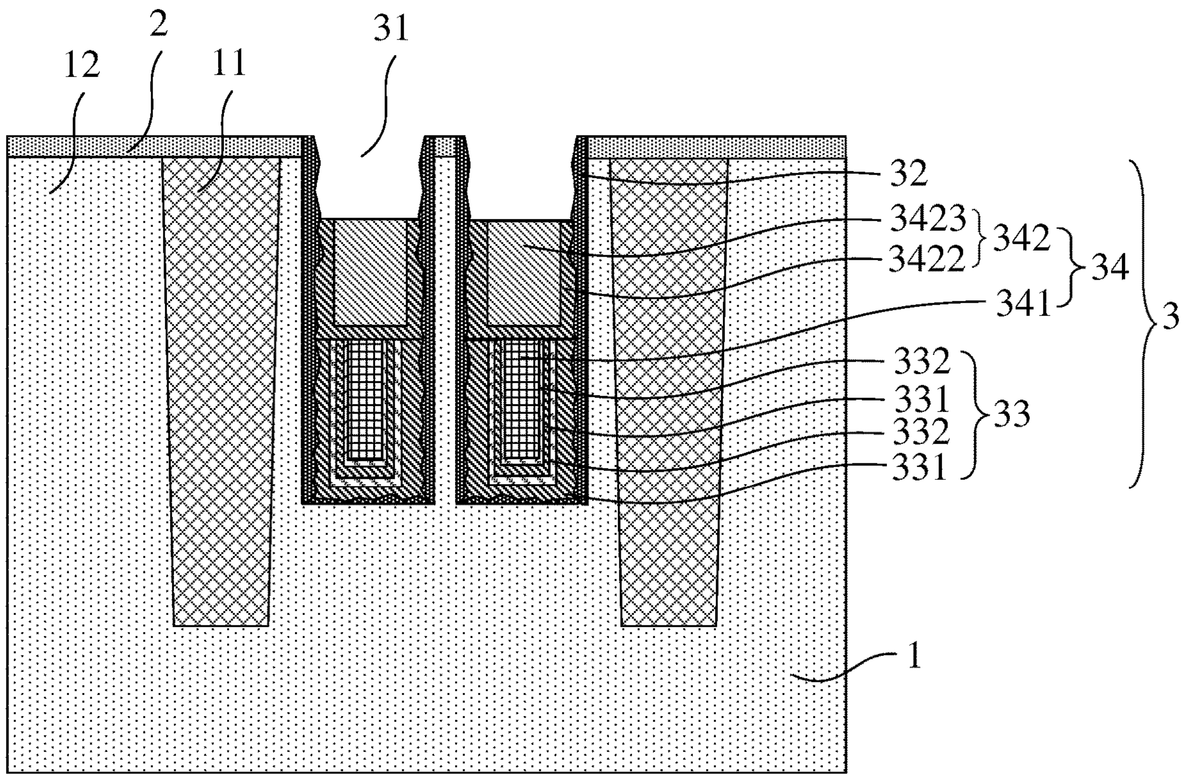
FIG. 23 is a schematic sectional view of a structure obtained in operation S14123 in a method for manufacturing a semiconductor structure according to an embodiment of the present disclosure.

In S14123, the doped polysilicon material layer 34231 and the barrier material layer 34221 are etched back to obtain the barrier layer 3422 on the top face of the first conductive layer 341, the top face of the work function stacking structure 33 and the sidewall of the WL trench, and to obtain the doped polysilicon layer 3423 on an upper surface of the barrier layer 3422, as shown in FIG. 23.

Specifically, a titanium nitride layer may be formed on the upper surface of the covering dielectric layer 2, the top face of the first conductive layer 341, the top face of the work function stacking structure 33 and the sidewall of the WL trench 31 to serve as the barrier material layer 34221, namely the barrier layer 3422 may be the titanium nitride layer. The WL conductive layer 34 may include a first portion and a second portion. The first conductive layer 341 in the filling region 333 serves as the first portion. The second conductive layer 342 jointly formed by the barrier layer 3422 and the doped polysilicon layer 3423 serves as the second portion.

Figure 24:
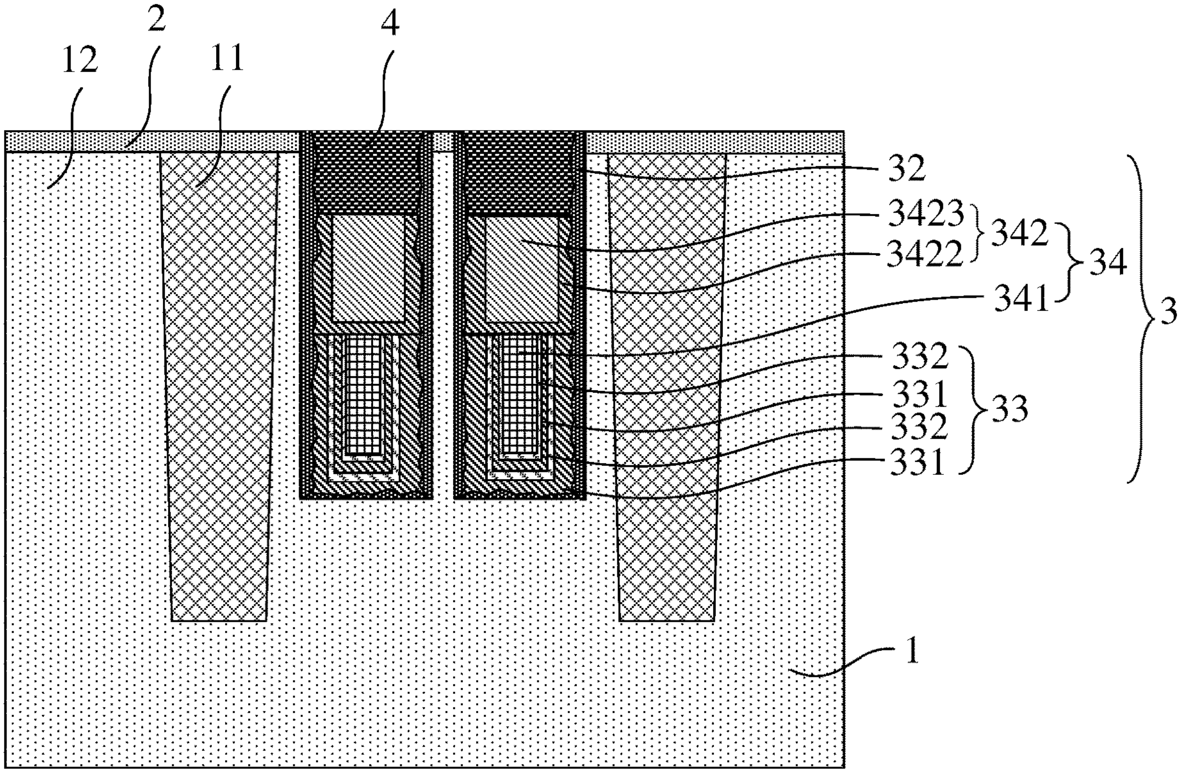
FIG. 24 is a schematic sectional view of a structure obtained in an operation of forming an insulating isolation layer on an upper surface of a WL conductive layer in a method for manufacturing a semiconductor structure according to an embodiment, the insulating isolation layer filling up a WL trench.

In the embodiment, referring to FIG. 23, the upper surface of the WL conductive layer 34 may be lower than the top of the WL trench 31. After the WL conductive layer 34 is formed in the WL trench 31, the method may further include that: An insulating isolation layer 4 is formed on the upper surface of the WL conductive layer 34, the insulating isolation layer 4 filling up the WL trench 31. A resulting structure is as shown in FIG. 24. Specifically, the insulating isolation layer 4 may include, but is not limited to, a silicon nitride layer or a silicon carbide layer.

It should be understood that although the operations in the flowcharts of embodiments are sequentially displayed according to the arrows, these operations are not necessarily performed in the order indicated by the arrows. The execution order of these operations is not strictly limited, and these operations may be executed in other orders, unless clearly described otherwise. Moreover, at least one of the operations in the flowcharts of the embodiments may include multiple operations or stages. The operations or stages are unnecessarily executed at the same time, but may be executed at different times. The execution order of the operations or stages is unnecessarily carried out sequentially, but may be executed alternately with other operations or at least one of the operations or stages of other operations.

The present disclosure further provides a semiconductor structure. As shown in FIG. 20, the semiconductor structure includes a substrate 1 and a WL structure 3. The WL structure 3 includes a work function stacking structure 33, a WL conductive layer 34, and a gate oxide layer 32. The work function stacking structure 33 is located in the substrate 1. The work function stacking structure 33 includes multiple sequentially and alternately stacked first work function layers 331 and second work function layers 332. A work function of the first work function layer 331 is greater than a work function of the second work function layer 332. The WL conductive layer 34 is located in the substrate 1, and located on an upper surface of the work function stacking structure 33. The gate oxide layer 32 is located between the work function stacking structure 33 and the substrate 1 as well as between the WL conductive layer 34 and the substrate 1.

According to the above embodiment, the semiconductor structure includes a substrate 1 and a WL structure. The WL structure includes a work function stacking structure 33, a WL conductive layer 34, and a gate oxide layer 32. The gate oxide layer 32 is located between the work function stacking structure 33 and the substrate 1 as well as between the WL conductive layer 34 and the substrate 1. That is, the work function stacking structure 33 is located on a surface of the gate oxide layer 32, such that the problem of an increased gate leakage current due to thickness reduction of the gate oxide layer 32 can be alleviated. The work function stacking structure 33 includes multiple sequentially and alternately stacked first work function layers 331 and second work function layers 332, and a work function of the first work function layer 331 is greater than a work function of the second work function layer 332. The WL conductive layer 34 is located on an upper surface of the work function stacking structure 33. In this way, it is possible to alleviate the problems of the PDE, boron penetration, and incompatibility with the high-K dielectric layer for the WL conductive layer 34 to reduce the electric leakage, thus better protecting the gate.

Specifically, the substrate 1 may include, but is not limited to, at least one of a silicon substrate, a germanium substrate, a silicon-germanium substrate, a gallium arsenide substrate, a gallium nitride substrate, or a silicon carbide substrate. Specifically, the substrate 1 may be any one of the silicon substrate, the germanium substrate, the silicon-germanium substrate, the gallium arsenide substrate, the gallium nitride substrate and the silicon carbide substrate, and may also be a composite substrate 1 combined by two or more of the silicon substrate, the germanium substrate, the silicon-germanium substrate, the gallium arsenide substrate, the gallium nitride substrate and the silicon carbide substrate. The first work function layer 331 may include a titanium nitride layer. The second work function layer 332 may include, but is not limited to, a titanium layer, a tantalum layer, or a tantalum nitride layer.

In an embodiment, the first work function layer 331 may include a titanium nitride layer, the second work function layer 332 may include a titanium layer, a tantalum layer, or a tantalum nitride layer, and the WL conductive layer 34 may include a doped polysilicon layer.

Specifically, the work function of the first work function layer 331 may be greater than the work function of the second work function layer 332. With the greater work function of the first work function layer 331, stress accumulation is caused in formation of the first work function layer 331. Therefore, by combining the second work function layer 332 having the smaller work function with the first work function layer 331, there are a larger binding force and a smaller stress to reduce the electric leakage.

Exemplarily, the first work function layer 331 may have a thickness of 0.7 nm to 1.2 nm. Specifically, the first work function layer 331 may have a thickness of 0.7 nm, 0.8 nm, 0.9 nm, 1 nm, 1.1 nm or 1.2 nm, and may also have any thickness between 0.7 nm and 1.2 nm. The thickness is not limited to those listed in the embodiment.

In an embodiment, referring to FIG. 15, FIG. 19 and FIG. 23, the WL conductive layer 34 may include a first portion and a second portion. The first portion is located under the second portion. The work function stacking structure 33 surrounds a sidewall and a bottom face of the first portion. The second portion covers a top face of the first portion and a top face of the work function stacking structure 33.

Specifically, referring to FIG. 13 to FIG. 14, in FIG. 15, the first portion of the WL conductive layer 34 is located in a filling region 333. The second portion covers a top face of the first portion and a top face of the work function stacking structure 33. In FIG. 19, a first conductive layer 341 in the filling region 333 serves as the first portion of the WL conductive layer 34. A second conductive layer 342 covering a top face of the first conductive layer 341 and a top face of the work function stacking structure 33 serves as the second portion of the WL conductive layer 34. In FIG. 23, a first conductive layer 341 in the filling region 333 serves as the first portion of the WL conductive layer 34. A second conductive layer 342 jointly formed by a barrier layer 3422 and a doped polysilicon layer 3423 serves as the second portion of the WL conductive layer 34.

In an embodiment, referring to FIG. 15, the WL conductive layer 34 may be an N-type doped polysilicon layer. That is, the first portion and the second portion of the WL conductive layer 34 are made of a same material, and may be specifically made of a doped polysilicon material. A doped ion in the doped polysilicon material may include, but is not limited to, at least one of a phosphorus ion, an arsenic ion, or an antimony ion. A doping concentration of the doped ions in the doped polysilicon material may be 10E20 $cm^{-3}$ to 20E20 $cm^{-3}$. Specifically, the doping concentration may be 10E20 $cm^{-3}$, 12E20 $cm^{-3}$, 15E20 $cm^{-3}$, 18E20 $cm^{-3}$ or 20E20 $cm^{-3}$, and may also be any concentration between 10E20 $cm^{-3}$ and 20E20 $cm^{-3}$. The concentration is not limited to those listed in the embodiment. The work function of the WL conductive layer 34 can be changed through the concentration of the doped ions. Therefore, by controlling the concentration of the N-type doped ion, the work function can be reduced, thereby lowering the risk of the electric leakage.

In an embodiment, referring to FIG. 19, a first conductive layer 341 in the filling region 333 serves as the first portion of the WL conductive layer 34. A second conductive layer 342 covering a top face of the first conductive layer 341 and a top face of the work function stacking structure 33 serves as the second portion of the WL conductive layer 34.

In the embodiment, the first portion and the second portion are made of different materials. The first portion may include a titanium nitride layer. The second portion may include a doped polysilicon layer. A doped ion in the doped polysilicon layer may include, but is not limited to, at least one of a phosphorus ion, an arsenic ion, or an antimony ion. A doping concentration of the doped ions may be 10E20 $cm^{-3}$ to 20E20 $cm^{-3}$. Specifically, the doping concentration may be 10E20 $cm^{-3}$, 12E20 $cm^{-3}$, 15E20 $cm^{-3}$, 18E20 $cm^{-3}$ or 20E20 $cm^{-3}$, and may also be any concentration between 10E20 $cm^{-3}$ and 20E20 $cm^{-3}$. The concentration is not limited to those listed in the embodiment.

In an embodiment, referring to FIG. 23, a first conductive layer 341 in the filling region 333 serves as the first portion of the WL conductive layer 34. A second conductive layer 342 jointly formed by a barrier layer 3422 and a doped polysilicon layer 3423 serves as the second portion of the WL conductive layer 34. That is, the first portion and the second portion are made of different materials. The first portion may include a tungsten metal layer. The second portion may include the doped polysilicon layer 3423 and the barrier layer 3422. The barrier layer 3422 covers a sidewall and a bottom face of the doped polysilicon layer 3423.

Specifically, the barrier layer may include a titanium nitride layer.

In an embodiment, referring to FIG. 6, a WL trench 31 is formed in the substrate 1. Referring to FIG. 9, the gate oxide layer 32 covers a sidewall and a bottom of the WL trench 31. Referring to FIG. 13, the first work function layer 331 is located on a surface of the gate oxide layer 32. An upper surface of the work function stacking structure 33 is lower than a top of the WL trench 31. Referring to FIG. 15, the WL conductive layer 34 is located in the WL trench 31. An upper surface of the WL conductive layer 34 is lower than the top of the WL trench.

Specifically, the WL trench 31 may have a depth of 30 nm to 400 nm. Exemplarily, the WL trench 31 may have a depth of 30 nm, 50 nm, 100 nm, 200 nm, 300 nm or 400 nm, and may also have a depth between 30 nm and 400 nm. The depth is not limited to those listed in the embodiment.

In an embodiment, referring to FIG. 13 to FIG. 23, a surface of the gate oxide layer 32 may be a rough surface.

Specifically, the gate oxide layer 32 has the rough surface, such that the first work function layer 331 on the surface of the gate oxide layer 32 is more compact structurally.

In an embodiment, referring to FIG. 4, the semiconductor structure further includes a covering dielectric layer 2. The covering dielectric layer 2 is located on an upper surface of the substrate 1. The WL trench 31 penetrates through the covering dielectric layer 2 along a thickness direction, and extends into the substrate 1.

Specifically, the covering dielectric layer 2 may include a silicon dioxide layer or a silicon nitride layer.

In an embodiment, referring to FIG. 5, an STI structure 11 may further be provided in the substrate 1. The STI structure 11 isolates multiple spaced-apart active areas 12 in the substrate 1. The active areas 12 each extend along a first direction. The WL structure extends along a second direction. The second direction is intersected with the first direction.

Specifically, the STI structure 11 may be a structure in which a shallow-trench dielectric layer is filled in a shallow trench. The shallow-trench dielectric layer may be, but not limited to, a silicon dioxide layer.

In an embodiment, referring to FIG. 16, FIG. 20 and FIG. 24, the upper surface of the WL conductive layer 34 is lower than the top of the WL trench 31. The semiconductor structure further includes an insulating isolation layer 4. The insulating isolation layer 4 is located on the upper surface of the WL conductive layer 34, and fills up the WL trench 31.

Specifically, the insulating isolation layer 4 may include, but is not limited to, a silicon nitride layer or a silicon carbide layer.

The technical characteristics of the foregoing embodiments can be employed in arbitrary combinations. To provide a concise description of these examples, all possible combinations of all technical characteristics of the embodiment may not be described; however, these combinations of technical characteristics should be construed as disclosed in the description as long as no contradiction occurs.

The above embodiments are only intended to illustrate several implementations of the present disclosure in detail, and they should not be construed as a limitation to the patentable scope of the present disclosure. It should be noted that those of ordinary skill in the art can further make variations and improvements without departing from the conception of the present disclosure. These variations and improvements all fall within the protection scope of the present disclosure. Therefore, the protection scope of the present disclosure should be subject to the protection scope defined by the claims.

The invention claimed is:

1. A semiconductor structure, comprising a substrate and a word line (WL) structure located in a WL trench, wherein the WL structure comprises:

a work function stacking structure located in the substrate, wherein an upper surface of the work function stacking structure is lower than a top face of the WL trench, the work function stacking structure comprises a plurality of sequentially and alternately stacked first work function layers and second work function layers, and a work function of the first work function layer is greater than a work function of the second work function layer;

a WL conductive layer located in the substrate, and located on an upper surface of the work function stacking structure; and a gate oxide layer located between the work function stacking structure and the substrate as well as between the WL conductive layer and the substrate;

wherein the first work function layer comprises a titanium nitride layer, and the second work function layer comprises at least one of a titanium layer, a tantalum layer, or a tantalum nitride layer.

2. The semiconductor structure of claim 1, wherein the WL conductive layer comprises a first portion and a second portion, the first portion is located under the second portion, the work function stacking structure has a "U" shaped cross-section and the work function stacking structure surrounds a sidewall and a bottom face of the first portion, and the second portion covers a top face of the first portion and a top face of the work function stacking structure.

3. The semiconductor structure of claim 2, wherein the first portion and the second portion are made of a same material, and are specifically made of doped polysilicon.

4. The semiconductor structure of claim 2, wherein the first portion and the second portion are made of different materials, the first portion comprises a titanium nitride layer, and the second portion comprises a doped polysilicon layer.

5. The semiconductor structure of claim 2, wherein the first portion and the second portion are made of different materials, the first portion comprises a tungsten metal layer, the second portion comprises a doped polysilicon layer and a barrier layer, and the barrier layer covers a sidewall and a bottom face of the doped polysilicon layer.

6. The semiconductor structure of claim 1, wherein the WL trench is formed in the substrate; the gate oxide layer covers a sidewall and a bottom of the WL trench; the first work function layer is located on a surface of the gate oxide layer; and the WL conductive layer is located in the WL trench, and an upper surface of the WL conductive layer is lower than a top of the WL trench.

7. The semiconductor structure of claim 6, wherein the surface of the gate oxide layer in the WL trench is a rough surface.

8. The semiconductor structure of claim 6, wherein the WL structure further comprises an insulating isolation layer located on the upper surface of the WL conductive layer and filling up the WL trench.

9. A method for manufacturing a semiconductor structure, comprising:

providing a substrate;

forming a word line (WL) trench in the substrate;

forming a gate oxide layer on a sidewall and a bottom of the WL trench, and forming a work function stacking structure on a surface of the gate oxide layer, wherein an upper surface of the work function stacking structure is lower than a top face of the WL trench; and the work function stacking structure comprises a plurality of sequentially and alternately stacked first work function layers and second work function layers, and a work function of the first work function layer is greater than a work function of the second work function layer; and forming a WL conductive layer in the WL trench, the WL conductive layer being located on the upper surface of the work function stacking structure;

wherein the first work function layer comprises a titanium nitride layer, and the second work function layer comprises at least one of a titanium layer, a tantalum layer, or a tantalum nitride layer.

10. The method for manufacturing a semiconductor structure of claim 9, wherein forming the gate oxide layer on the sidewall and the bottom of the WL trench comprises: forming a gate oxide material layer on the substrate, the sidewall of the WL trench and the bottom of the WL trench; and roughening a surface of the gate oxide material layer in the WL trench.

11. The method for manufacturing a semiconductor structure of claim 10, wherein forming the work function stacking structure on the surface of the gate oxide layer comprises: forming a plurality of sequentially and alternately stacked first work function material layers and second work function material layers on the gate oxide material layer; and respectively etching back the first work function material layers and the second work function material layers to obtain the work function stacking structure, the work function stacking structure lining the WL trench to forming a filling region.

12. The method for manufacturing a semiconductor structure of claim 11, wherein forming the WL conductive layer in the WL trench comprises: depositing a conductive material layer, the conductive material layer filling up the filling region and the WL trench; and etching back the conductive material layer to obtain the WL conductive layer in the WL trench.

13. The method for manufacturing a semiconductor structure of claim 11, wherein forming the WL conductive layer in the WL trench comprises: forming a first conductive layer, the first conductive layer filling up the filling region; and forming a second conductive layer, the second conductive material layer being located in the WL trench, and covering a top face of the first conductive layer and a top face of the work function stacking structure.

14. The method for manufacturing a semiconductor structure of claim 13, wherein the first conductive layer is formed with a metal layer, the second conductive layer comprises a barrier layer and a doped polysilicon layer, and the barrier layer is formed between the doped polysilicon layer and the substrate.

15. The method for manufacturing a semiconductor structure of claim 9, further comprising: after forming the WL conductive layer in the WL trench, forming an insulating isolation layer on an upper surface of the WL conductive layer, the insulating isolation layer filling up the WL trench.

16. The method for manufacturing a semiconductor structure of claim 9, further comprising: before forming the WL trench in the substrate, forming a shallow trench isolation (STI) structure in the substrate, the STI structure isolating a plurality of spaced-apart active areas in the substrate.

* * * * *